United States Patent
Nguyen

[11] Patent Number: 6,057,604
[45] Date of Patent: May 2, 2000

[54] INTEGRATED CIRCUIT CONTACT STRUCTURE HAVING GATE ELECTRODE PROTECTION FOR SELF-ALIGNED CONTACTS WITH ZERO ENCLOSURE

[75] Inventor: Loi N. Nguyen, Carrollton, Tex.

[73] Assignee: STMicroelectronics, Inc., Carrollton, Tex.

[21] Appl. No.: 08/885,642

[22] Filed: Jun. 30, 1997

Related U.S. Application Data

[63] Continuation-in-part of application No. 08/639,316, Apr. 24, 1996, Pat. No. 5,793,114, which is a continuation of application No. 08/392,061, Feb. 22, 1995, abandoned, which is a division of application No. 08/169,587, Dec. 17, 1993, Pat. No. 5,439,846.

[51] Int. Cl.[7] .......................... H01L 23/58; H01L 23/48; H01L 23/52
[52] U.S. Cl. .......................... 257/774; 257/640; 257/641; 257/649; 257/650
[58] Field of Search .................................. 257/410, 411, 257/413, 400, 773, 774, 640, 641, 649, 650; 438/231

[56] References Cited

U.S. PATENT DOCUMENTS

| | | | |
|---|---|---|---|
| 4,292,728 | 10/1981 | Endo | 29/571 |
| 4,507,171 | 3/1985 | Bhatia et al. | 156/643 |
| 4,686,000 | 8/1987 | Heath | 156/643 |
| 4,830,971 | 5/1989 | Shibata | 437/29 |
| 4,931,845 | 6/1990 | Ema | 257/751 |
| 4,997,790 | 3/1991 | Woo et al. | 437/195 |
| 5,057,902 | 10/1991 | Haskell | 357/71 |
| 5,075,762 | 12/1991 | Kondo et al. | 357/71 |
| 5,158,910 | 10/1992 | Cooper et al. | 438/631 |
| 5,166,771 | 11/1992 | Godinho et al. | 257/368 |
| 5,206,187 | 4/1993 | Doan et al. | 437/192 |
| 5,231,055 | 7/1993 | Smith | 437/192 |
| 5,286,667 | 2/1994 | Lin et al. | 437/52 |
| 5,290,728 | 3/1994 | Sato | 437/52 |
| 5,373,678 | 12/1994 | Hesser | 52/592.1 |
| 5,459,354 | 10/1995 | Hara | 257/754 |
| 5,477,074 | 12/1995 | Yen | 257/377 |
| 5,519,239 | 5/1996 | Chu | 257/752 |
| 5,614,756 | 3/1997 | Forouhi et al. | 257/757 |
| 5,691,561 | 11/1997 | Goto | 257/774 |

FOREIGN PATENT DOCUMENTS

| | | | |
|---|---|---|---|
| 1-122139 | 5/1989 | Japan | 257/413 |
| 1-273347 | 11/1989 | Japan | 257/413 |
| 4-49670 | 2/1992 | Japan | 257/413 |
| 5-211131 | 8/1993 | Japan | 257/774 |

OTHER PUBLICATIONS

F.H. Kusters, et al, "Self Aligned Bitline Contact for 4 Mbit DRAM," Extended ABstracts, vol. 87–1, The Electrochem. Soc. 1987, p. 289.

IBM Technical Disclosure Bulletin vol. 32, No. 4A Sep. 1989, p. 344.

"A New Technology for Oxide Contact and Via Etch," Semiconductor International, Aug., 1993, p. 36.

*Primary Examiner*—Mahshid Saadat
*Assistant Examiner*—Jhihan B. Clark
*Attorney, Agent, or Firm*—Theodore E. Galanthay; Lisa K. Jorgenson; Dan E. Venglarik

[57] ABSTRACT

A technique for forming integrated circuit device contacts includes the formation of nitride spacers along side gate electrodes for LDD definition. In addition, a nitride cap layer is formed over the gate electrodes. When a contact opening is formed through the interlevel oxide dielectric, the nitride cap and sidewall spacers protect the gate electrode from damage and shorting. A highly doped poly plug is formed in the opening to make contact to the underlying substrate. Metalization is formed over the poly plug in the usual manner.

20 Claims, 2 Drawing Sheets

6,057,604

INTEGRATED CIRCUIT CONTACT STRUCTURE HAVING GATE ELECTRODE PROTECTION FOR SELF-ALIGNED CONTACTS WITH ZERO ENCLOSURE

CROSS REFERENCE TO RELATED APPLICATIONS

The present application is a continuation-in-part of U.S. application Ser. No. 08/639,316, filed Apr. 24, 1996, titled SELF-ALIGNED METHOD FOR FORMING CONTACT WITH ZERO OFFSET TO GATE, issued a U.S. Pat. No. 5,793,114; which is a continuation of U.S. application Ser. No. 08/392,061, filed Feb. 22, 1995, titled SELF-ALIGNED METHOD FOR FORMING CONTACT WITH ZERO OFFSET TO GATE, abandoned; which is a divisional of U.S. application Ser. No. 08/169,587, filed Dec. 17, 1993, titled SELF-ALIGNED METHOD FOR FORMING CONTACT WITH ZERO OFFSET TO GATE, issued as U.S. Pat. No. 5,439,846. All of these applications and patents were invented by Loi Nguyen, the inventor of the present application, and Robert L. Hodges. All applications and patents are assigned to SGS-Thomson Microelectronics, Inc., the assignee of the present application. The above applications and patent are hereby incorporated by reference, and their entirety, into the present application.

BACKGROUND OF THE INVENTION

1. Field of the Invention

The present invention relates generally to the fabrication of semiconductor integrated circuit devices, and more specifically to a technique for fabricating contacts with zero offset.

2. Description of the Prior Art

Formation of field effect transistors in integrated circuits often includes the formation of lightly doped drain (LDD) regions adjacent the channel. This minimizes hot-electron effects, and improves operation of the transistor. In order to form these LDD regions using a self-aligned process, a sidewall oxide ($SiO_2$) spacer is formed along side the transistor gate.

When forming the oxide sidewall spacers, it is necessary to over etch the oxide layer from which they are formed in order to insure that all contact areas are completely clear. This over etching also damages field oxide regions, and significant over etch of the field oxide regions can allow implanted dopants to penetrate through the field oxide during later source/drain formation.

Also, it is necessary to insure that substrate contacts are not misaligned so as to extend over the gate electrodes. When this type of misalignment happens, etching required to clear the contact of interlevel oxide can damage the oxide cap and sidewall spacers on the gate. Significant damage of the oxide sidewall spacer can cause a short between the sidewall and gate.

A number of processing approaches have been used to address these and other problems. One approach is to deposit a thick oxide on top of the gate prior to the gate definition etch. This provides some margin, but does not solve the problem of the required enclosure near gate electrodes.

Other approaches use additional poly layers as "landing pads" for contacts in the matrix of DRAM and SRAM devices.

As described in parent application Ser. No. 639,316, which has been incorporated herein to by reference, spacers formed of silicon nitride may be used for LDD definition. These spacers protect the gate from later over etching during contact formation, because silicon nitride and oxide can be highly selectively etched over each other.

As device geometries continue to shrink, contacts are formed which have a very high aspect ratio. This is particularly true between adjacent gate electrodes in a device having regular structure, such as a memory matrix. It is difficult to provide sufficient barrier metal at the bottom of these high aspect ratio openings to provide proper protection for the underlying substrate.

It would therefore be desirable to provide an improved technique for fabricating contacts and semiconductor integrated circuits which addresses and solves the problems described above.

SUMMARY OF THE INVENTION

Therefore, in accordance with the present invention, a technique for forming integrated circuit device contacts includes the formation of nitride spacers along side gate electrodes for LDD definition. In addition, a nitride cap layer is formed over the gate electrodes. When a contact opening is formed through the interlevel oxide dielectric, the nitride cap and sidewall spacers protect the gate electrode from damage and shorting. A highly doped poly plug is formed in the opening to make contact to the underlying substrate. Metalization is formed over the poly plug in the usual manner.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figure representing cross-sections of portions of an integrated circuit during fabrication are not drawn to scale, but instead are drawn so as to illustrate the important features of the invention.

Figure 1:
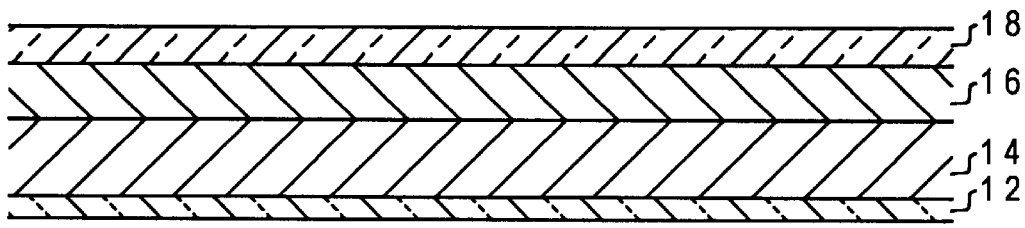
FIG. 1 depicts a selected portion of an integrated circuit substrate in which a contact is to be formed in accordance with the present invention.
Figure 2:
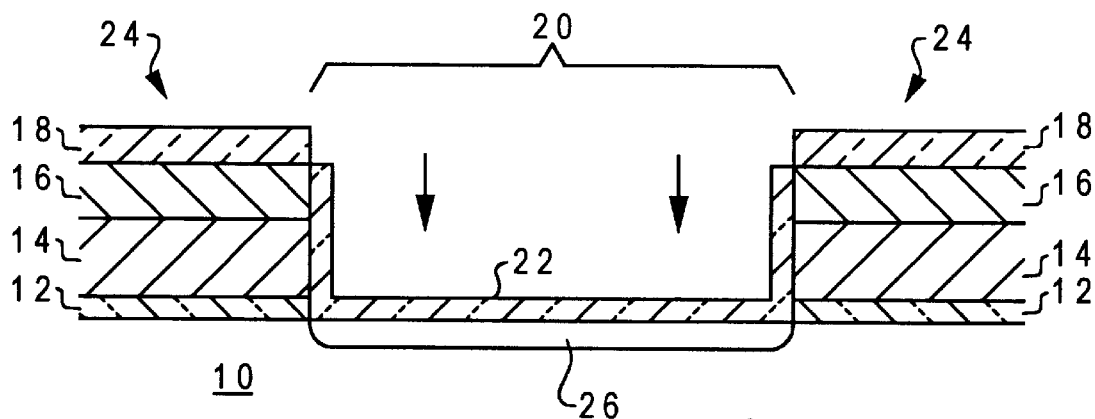
FIG. 2 illustrates the integrated circuit substrate with gate electrodes and a protective capping layer in accordance with the present invention.

Referring to FIG. 1, a contact is to be formed to a selected portion of integrated circuit substrate 10. On an upper surface of the substrate is formed a gate oxide layer 12, which may be a thermal oxide or ONO layer as known in the art. Polycrystalline silicon layer 14 is deposited over the gate oxide layer 12, and doped to improve conductivity as known in the art. Preferably, a refractory metal silicide layer 16 can be formed over the polycrystalline silicon layer 14 to improve conductivity of the poly layer. Finally, a layer of silicon nitride 18 is deposited over the refractory metal silicide layer 16.

Using photoresist (not shown) as known in the art, the device is patterned and etched to form an opening 20 through layers 12, 14, 16, 18, and expose a portion of substrate 10. A reoxidation step is performed as known in the art to form a thermal oxide layer 22 on the exposed substrate surface. Oxide layer 22 also forms along side sidewalls of the gate electrodes 24 which were defined by the previous etch step. A dopant implant step is performed to create LDD region 26 between the gate electrodes 24.

Figure 3:
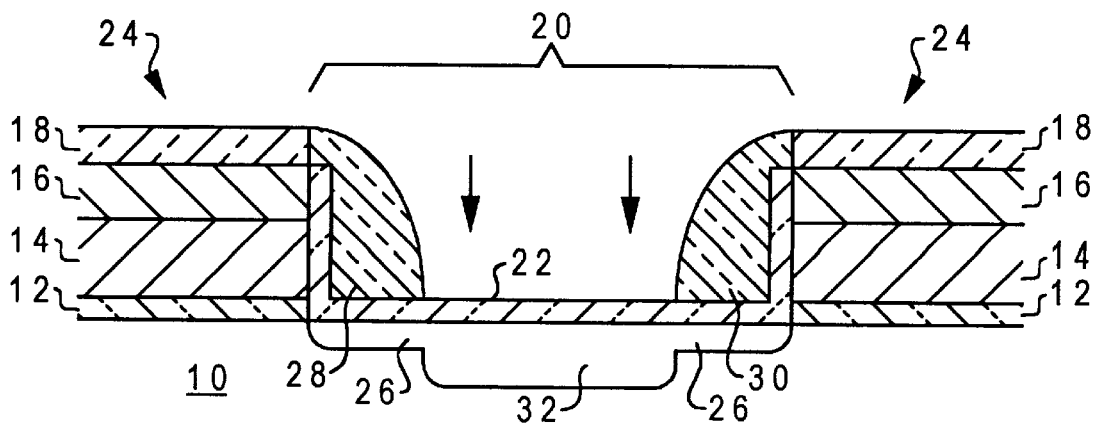
FIG. 3 depicts the integrated circuit substrate with sidewall spacers alongside the gate electrodes in accordance with the present invention.

Referring to FIG. 3, nitride sidewall spacers 28, 30 are formed alongside the gate electrodes 24 as known in the art. These spacers are formed by a blanket conformal deposition of silicon nitride, followed by anisotropic etch back to leave sidewall spacers 28, 30. A heavy dopant implant is used to form source/drain region 32, with the sidewall spacers 28, 30 defining LDD regions 26 for the two transistors.

Figure 4:
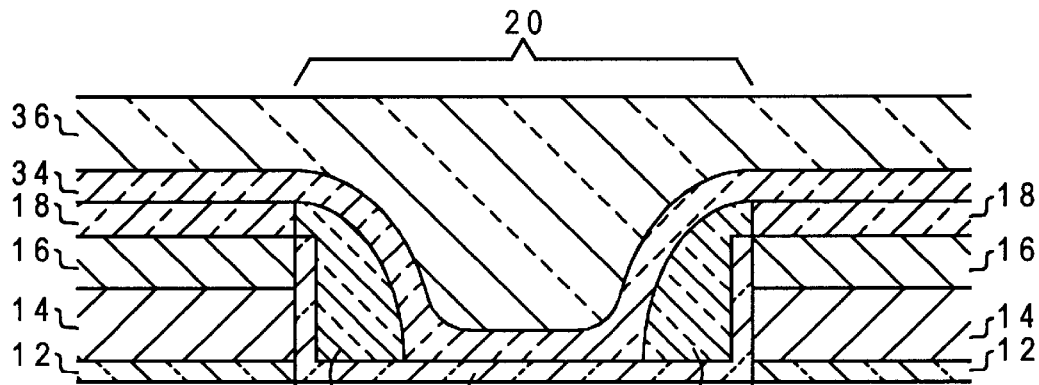
FIG. 4 illustrates the integrated circuit substrate with an interlevel dielectric layer in accordance with the present invention.

Referring to FIG. 4, the interlevel oxide layer is then formed over the device. In a preferred embodiment, a layer 34 of undoped oxide is conformally deposited over the device, followed by a layer of BPSG, or similar oxide such as SOG. Deposition of SOG, or reflow of a BPSG layer, provides a relatively planar upper surface for layer 36.

Figure 5:
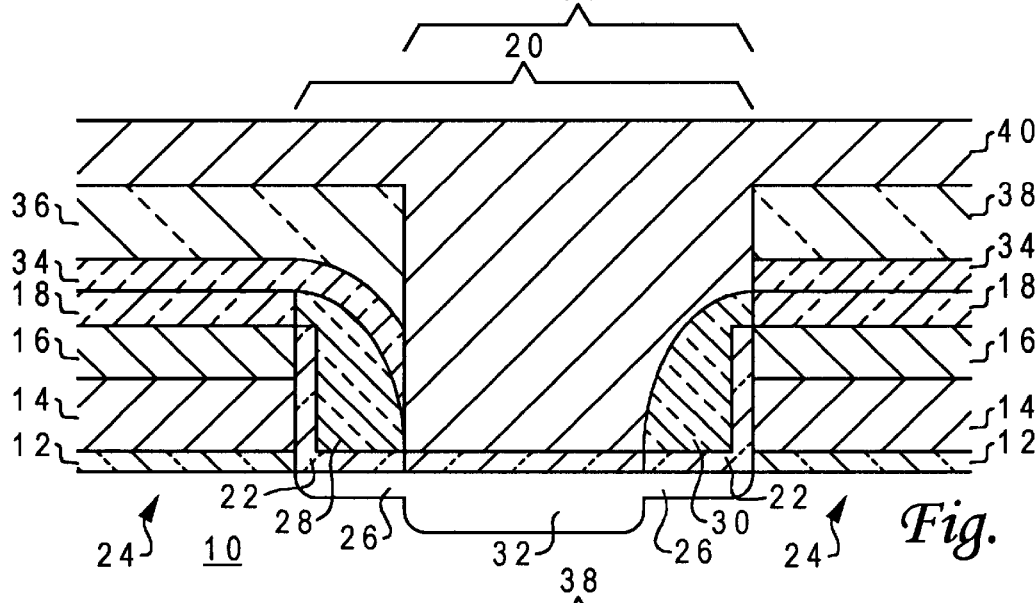
FIG. 5 depicts the integrated circuit substrate with an contact opening through the interlevel dielectric layer exposing a portion of the substrate in accordance with the present invention.

Referring to FIG. 5, an opening 38 is etched through the interlevel oxide to expose portions of the substrate 10. This etch will remove portions of layers 36, 34, and 22. An etch is used which is selective for oxide over nitride, so that the sidewall spacers 28, 30, and the nitride cap layer 18, protects the gate 24 during this step.

In FIG. 5, the opening 38 is misaligned with respect to the contact region with the substrate 10. Ideally, opening 38 would be properly aligned. However, in actual processing it is common for openings to be somewhat misaligned as shown. Because nitride layer 18 and spacers 28, 30 protect the gates 24 during the opening etch step, alignment is not critical during this self-aligned process.

Once opening 38 has been formed, a layer of doped amorphous or polycrystalline silicon 40 is formed over the device. This layer should be formed to a depth sufficient to completely fill all openings such as opening 38, which will typically leave fairly thick portions of layer 40 over regions outside the opening 38.

Figure 6:
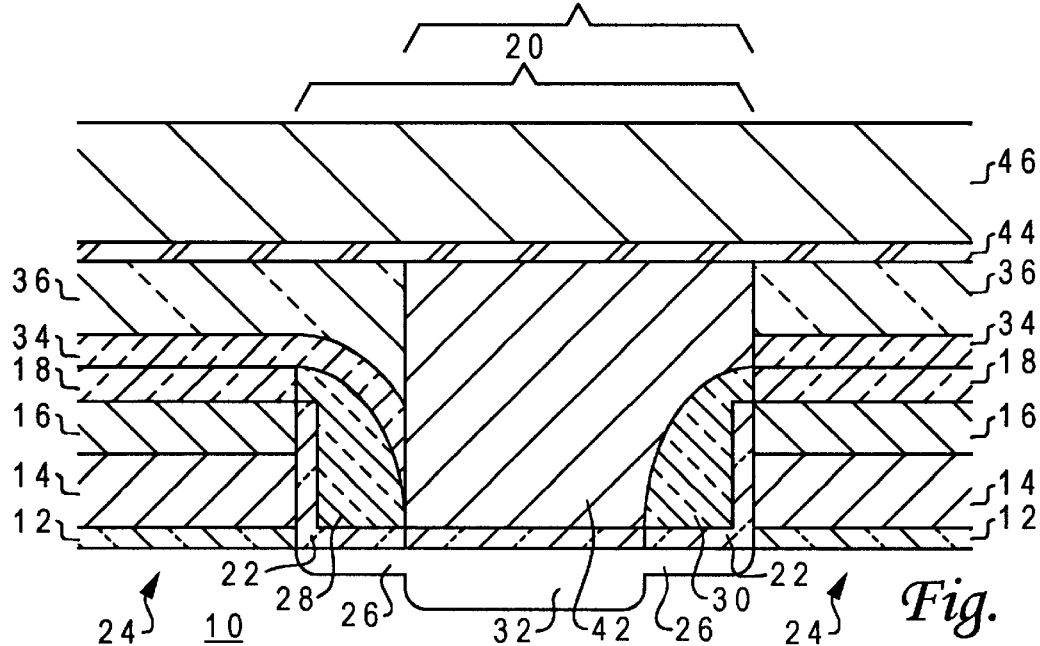
FIG. 6 illustrates the integrated circuit substrate with a conductive plug within the contact opening and an interconnect layer over the plug and interlevel dielectric. in accordance with the present invention.
Figure 4:
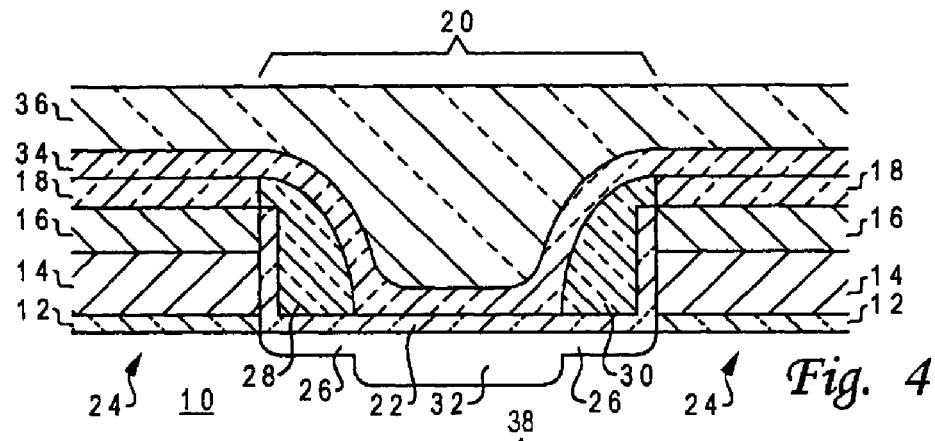
Figure 5:
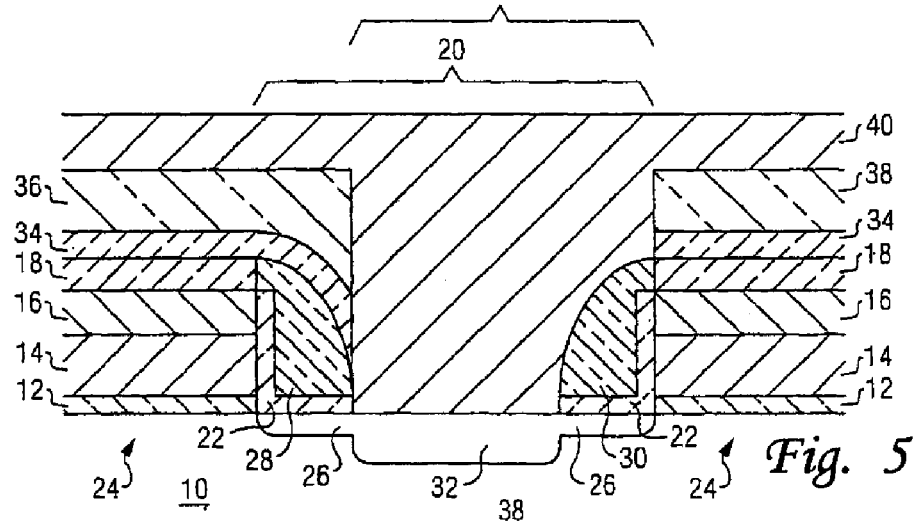
Figure 6:
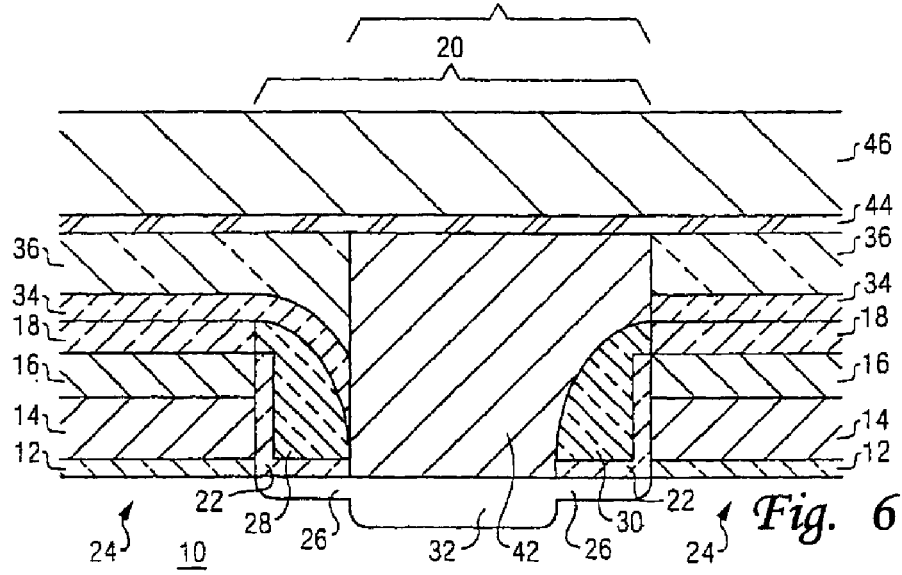

Referring to FIG. 6, polycrystalline silicon layer 40 is etched back, using chemical and mechanical polishing, or other etchback techniques, to form an amorphous or polycrystalline silicon reach-up plug 42. As shown in FIG. 6, plug 42 has an upper surface approximately coplanar with the upper surface of oxide layer 36. In actual practice, plug 42 will usually be etched a little below the surface of oxide layer 36 to ensure that all amorphous or polycrystalline silicon is removed from the surface of layer 36.

A barrier metal layer 44 is formed over the device, followed by aluminum (typically aluminum alloy with small amounts of copper and silicon) layer 46. The barrier layer is typically formed from materials such as titanium and titanium nitride. The metal layer 44 may also be formed from tungsten or another suitable material. Because the upper surface of plug 42 is approximately co-planar with the upper surface of oxide layer 36, the barrier metal layer 44 is formed with 100% coverage. In other words, because the barrier metal layer 44 does not reach down into a relatively deep opening having a high aspect ratio, a good, reliable barrier layer is formed. This remains true even if the layer 40 is overetched somewhat; the upper surface of the plug 42 is close enough to the surface of oxide layer 36 that the problems caused by PVD of a metal into a deep opening do not occur. The high quality of barrier layer 44 on the plug 42 prevents the formation of junction spikes (if the interconnect material is aluminum) or volcanos (if the interconnect material is tungsten).

Although FIG. 6 shows the use of a metal layer over the poly plug 42, this technique can be used with multiple levels of poly/silicide contacts as well.

In a typical embodiment, the following ranges of layer thicknesses and sizes may be used. As will be appreciated by those skilled in the art, these numbers may be modified to suit various processing requirements.

Typically, polycrystalline silicon layer 14 has a thickness of between 1500 and 2000 angstroms, as does silicide layer 16. Typically, the poly layer is a little thicker than silicide layer 16. Silicon nitride layer 18 preferably has a thickness of approximately 1000 angstroms. Layers 16 and 18 are preferably deposited using CVD processing.

The silicon nitride layer which is deposited to form spacers 28, 30 is typically deposited to a thickness of 2000 to 4000 angstroms. Thickness of this layer is determined by the necessary spacer width of the resulting sidewalls. Polycrystalline silicon layer 40 is preferably deposited using a technique such as LPCVD, which generally results in amorphous rather than polycrystalline silicon. Preferably, layer 40 is doped in situ but doping could be done afterward using techniques known in the art.

It will be appreciated by those skilled in the art that materials other than those specified may be used for the sidewall and top cap layers. The sidewalls should have the property that they can be selectively etched over the material used for the interlevel dielectric, and vice versa. Also, depending on the application, materials other than amorphous or polycrystalline silicon could be used to form the reach-up plug in the opening.

When a contact is formed using the technique described above, a superior contact is formed while completely protecting the gate electrodes from damage due to contact opening misalignment. Because the gate is so well protected, zero enclosure designs are possible. Because the material in plug 42 is very highly doped, typically approximately $10^{20}$ atoms/cm$^3$, contact resistance remains low even in cases of fairly significant misalignment.

Although the invention has been described with reference to a specific embodiment, this description is not meant to be construed in a limiting sense. Various modifications of the disclosed embodiment as well as alternative embodiments of the invention will become apparent to persons skilled in the art upon reference to the description of the invention. It is therefore contemplated that the appended claims will cover any such modifications or embodiments that fall within the true scope of the invention.

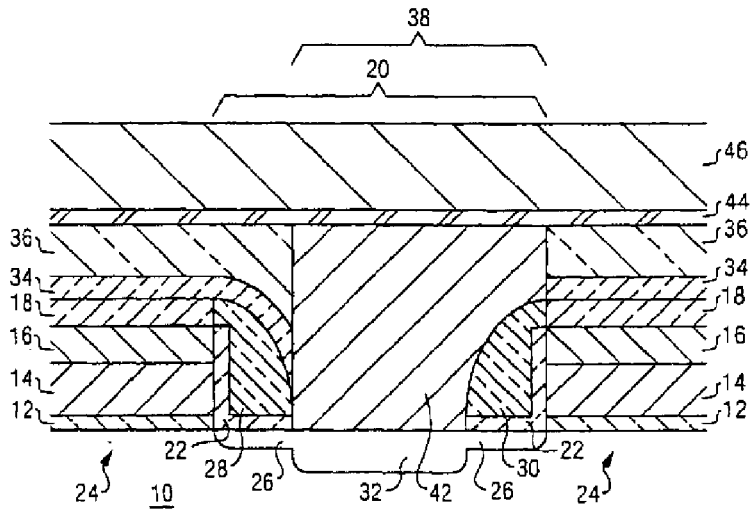

What is claimed is:

1. A contact structure for an integrated circuit device, comprising:
    a substrate having a surface;
    a gate electrode on the substrate surface, wherein the gate electrode has a cap layer of a first material;
    a sidewall alongside the gate electrode comprising:
        a second material selectively etchable over the first material on a side of the gate electrode and the substrate surface adjacent the gate electrode; and
        the first material on the second material alongside the gate electrode and over the substrate surface;
    a interlevel dielectric layer of the second material over the gate electrode on the capping layer and over the sidewall and the substrate surface, the interlevel dielectric layer having an opening therethrough to expose a portion of the substrate surface adjacent the sidewall, wherein a portion of the sidewall is also exposed in the opening;
    a conductive plug in the opening in contact with the substrate surface and the exposed portion of the sidewall the conductive plug filling the opening and having an upper surface substantially planar with an upper surface of the interlevel dielectric layer; and
    an interconnect layer on the interlevel dielectric layer and the conductive plug.

2. The contact structure of claim 1, wherein the first material comprises silicon nitride, and the second material comprises silicon oxide.

3. The contact structure of claim 1, wherein the conductive plug comprises doped polycrystalline silicon.

4. The contact structure of claim 1, wherein the interconnect layer comprises:
    a barrier layer on the interlevel dielectric and the conductive plug; and
    a metal layer on the barrier layer.

5. The contact structure of claim 1, wherein the gate electrode comprises:
    a gate dielectric layer;
    a doped polycrystalline silicon layer on the dielectric layer; and
    a refractory metal silicide layer on the polycrystalline silicon layer.

6. The contact structure of claim 1, further comprising a thermal oxide layer between the sidewall and the substrate surface, and between the sidewall and the gate electrode.

7. The contact structure of claim 1, further comprising:
    a lightly doped drain region in the substrate beneath the sidewall; and
    a heavily doped source/drain region in the substrate beneath the conductive plug.

8. The contact structure of claim 4, wherein the barrier layer comprises titanium.

9. The contact structure of claim 4, wherein the barrier layer comprises titanium nitride.

10. The contact structure of claim 4, wherein the metal layer comprises aluminum.

11. The contact structure of claim 4, wherein the metal layer comprises tungsten.

12. A contact structure for an integrated circuit device, comprising:
    a substrate having a heavily doped region and lightly doped regions adjacent the heavily doped region;
    a gate electrode over the substrate, the gate electrode having sides and a top;
    a first dielectric material on the sides and top of the gate electrode;
    a second dielectric material over the first dielectric material and the substrate, the second dielectric material having an opening therethrough to expose a portion of the substrate adjacent the gate electrode, wherein the second material may be selectively etched over the first material;
    a conductive plug in the opening in contact with the substrate; and
    an interconnect layer on the interlevel dielectric layer and the conductive plug.

13. The contact structure of claim 12, wherein the opening is aligned with a heavily doped region within the substrate.

14. The contact structure of claim 12, wherein the first dielectric material on the sides of the gate electrode comprise sidewalls aligned with the lightly doped regions within the substrate.

15. The contact structure of claim 12, wherein the first dielectric material comprises nitride.

16. The contact structure of claim 12, wherein the second dielectric material comprises oxide.

17. A contact structure for an integrated circuit device, comprising:
    a substrate having a heavily doped region and lightly doped regions adjacent the heavily doped region;
    a gate electrode over the substrate, the gate electrode having sides and a top;
    a first dielectric material on the sides and top of the gate electrode;
    a second dielectric material over the first dielectric material and the substrate, the second dielectric material having an opening therethrough to expose a portion of the substrate adjacent the gate electrode, wherein the opening is aligned with the heavily doped region within the substrate;
    a conductive plug in the opening in contact with the substrate; and
    an interconnect layer on the interlevel dielectric layer and the conductive plug.

18. The contact structure of claim 17, wherein the second material may be selective etched over the first material.

19. The contact structure of claim 17, wherein the first dielectric material comprises nitride.

20. The contact structure of claim 17, wherein the second dielectric material comprises oxide.

* * * * *

UNITED STATES PATENT AND TRADEMARK OFFICE
CERTIFICATE OF CORRECTION

| | | |
|---|---|---|
| PATENT NO. | : 6,057,604 | |
| APPLICATION NO. | : 08/885642 | |
| DATED | : May 2, 2000 | |
| INVENTOR(S) | : Nguyen | |

It is certified that error appears in the above-identified patent and that said Letters Patent is hereby corrected as shown below:

The Title page, showing an illustrative figure, should be deleted and substitute therefor the attached title page.

DELETE DRAWING SHEET 2 AND SUBSTITUTE THEREFOR THE DRAWING SHEET CONSISTING OF FIGS 4-6 SHOWN ON THE ATTACHED PAGES.

Signed and Sealed this

Twenty-first Day of April, 2009

JOHN DOLL
*Acting Director of the United States Patent and Trademark Office*

# United States Patent [19]

Nguyen

[11] Patent Number: 6,057,604
[45] Date of Patent: May 2, 2000

[54] INTEGRATED CIRCUIT CONTACT STRUCTURE HAVING GATE ELECTRODE PROTECTION FOR SELF-ALIGNED CONTACTS WITH ZERO ENCLOSURE

[75] Inventor: Loi N. Nguyen, Carrollton, Tex.

[73] Assignee: STMicroelectronics, Inc., Carrollton, Tex.

[21] Appl. No.: 08/885,642

[22] Filed: Jun. 30, 1997

Related U.S. Application Data

[63] Continuation-in-part of application No. 08/639,316, Apr. 24, 1996, Pat. No. 5,793,114, which is a continuation of application No. 08/392,061, Feb. 22, 1995, abandoned, which is a division of application No. 08/169,587, Dec. 17, 1993, Pat. No. 5,439,846.

[51] Int. Cl.$^7$ .................. H01L 23/58; H01L 23/48; H01L 23/52
[52] U.S. Cl. .................. 257/774; 257/640; 257/641; 257/649; 257/650
[58] Field of Search .................. 257/410, 411, 257/413, 400, 773, 774, 640, 641, 649, 650; 438/231

[56] References Cited

U.S. PATENT DOCUMENTS

| | | | |
|---|---|---|---|
| 4,292,728 | 10/1981 | Endo | 29/571 |
| 4,507,171 | 3/1985 | Bhatia et al. | 156/643 |
| 4,686,000 | 8/1987 | Heath | 156/643 |
| 4,830,971 | 5/1989 | Shibata | 437/29 |
| 4,931,845 | 6/1990 | Ema | 257/751 |
| 4,997,790 | 3/1991 | Woo et al. | 437/195 |
| 5,057,902 | 10/1991 | Haskell | 357/71 |
| 5,075,762 | 12/1991 | Kondo et al. | 357/71 |
| 5,158,910 | 10/1992 | Cooper et al. | 438/631 |
| 5,166,771 | 11/1992 | Godinho et al. | 257/368 |
| 5,206,187 | 4/1993 | Doan et al. | 437/192 |
| 5,231,055 | 7/1993 | Smith | 437/192 |
| 5,286,667 | 2/1994 | Lin et al. | 437/52 |
| 5,290,728 | 3/1994 | Sato | 437/52 |
| 5,373,678 | 12/1994 | Hesser | 52/592.1 |
| 5,459,354 | 10/1995 | Hara | 257/754 |
| 5,477,074 | 12/1995 | Yen | 257/377 |
| 5,519,239 | 5/1996 | Chu | 257/752 |
| 5,614,756 | 3/1997 | Forouhi et al. | 257/757 |
| 5,691,561 | 11/1997 | Goto | 257/774 |

FOREIGN PATENT DOCUMENTS

| | | | |
|---|---|---|---|
| 1-122139 | 5/1989 | Japan | 257/413 |
| 1-273347 | 11/1989 | Japan | 257/413 |
| 4-49670 | 2/1992 | Japan | 257/413 |
| 5-211131 | 8/1993 | Japan | 257/774 |

OTHER PUBLICATIONS

F.H. Kusters, et al, "Self Aligned Bitline Contact for 4 Mbit DRAM," Extended ABstracts, vol. 87–1, The Electrochem. Soc. 1987, p. 289.

IBM Technical Disclosure Bulletin vol. 32, No. 4A Sep. 1989, p. 344.

"A New Technology for Oxide Contact and Via Etch," Semiconductor International, Aug., 1993, p. 36.

*Primary Examiner*—Mahshid Saadat
*Assistant Examiner*—Jhihan B. Clark
*Attorney, Agent, or Firm*—Theodore E. Galanthay; Lisa K. Jorgenson; Dan E. Venglarik

[57] ABSTRACT

A technique for forming integrated circuit device contacts includes the formation of nitride spacers along side gate electrodes for LDD definition. In addition, a nitride cap layer is formed over the gate electrodes. When a contact opening is formed through the interlevel oxide dielectric, the nitride cap and sidewall spacers protect the gate electrode from damage and shorting. A highly doped poly plug is formed in the opening to make contact to the underlying substrate. Metalization is formed over the poly plug in the usual manner.

20 Claims, 2 Drawing Sheets